United States Patent
Huang

(10) Patent No.: US 6,289,293 B1
(45) Date of Patent: Sep. 11, 2001

(54) DEVICE AND METHOD FOR TESTING INPUT-OUTPUT PORTS

(75) Inventor: Tien-Yow Huang, Taoyuan Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/173,082

(22) Filed: Oct. 14, 1998

(30) Foreign Application Priority Data

Jun. 29, 1998 (TW) .................................. 87110437

(51) Int. Cl.$^7$ ...................................... G06F 11/00
(52) U.S. Cl. ............................ 702/117; 702/66; 714/724; 714/734; 714/739
(58) Field of Search ...................... 702/66, 117; 324/750, 324/73.1; 714/739, 734, 724

(56) References Cited

U.S. PATENT DOCUMENTS 4,870,346 * 9/1989 Mydill et al. ...................... 324/73 R

* cited by examiner

*Primary Examiner*—Kamini Shah
(74) *Attorney, Agent, or Firm*—Jiawei Huang; J.C. Patents

(57) ABSTRACT

A device for testing input-output (I/O) ports is disclosed, which comprises a plurality of switching devices and a decoder employed between the probe card and the device under test (DUT) card. Every switching device possesses an identical number of input ports and output ports to that of the testing I/O ports of the DUT card. The testing I/O ports of the DUT card are connected to the corresponding output ports of every switching device, respectively. The decoder is used to select a switching device, of which the output ports are connected to the DUT card for testing.

15 Claims, 3 Drawing Sheets

DEVICE AND METHOD FOR TESTING INPUT-OUTPUT PORTS

CROSS-REFERENCE TO RELATED APPLICATION

This application claims the priority benefit of Taiwan application serial no. 87110437, filed Jun. 29, 1998, the full disclosure of which is incorporated herein by reference.

BACKGROUND OF THE INVENTION

1. Field of Invention

The present invention generally relates to testing technology for a tester, and more particularly to a device and method for testing multiple input-output ports.

2. Description of Related Art

Conventional testers can only test a fixed number of input-output (IO) ports, for example, 32 or 64 I/O ports at one time, limiting the testing capacity for a large-size memory. As shown in FIG. 1, which shows a conventional method for testing I/O ports, in which corresponding relationship between the I/O ports of a device under test and probes is one-to-one. Also, probe card 10 is directly connected to device under test (DUT) card 20 via I/O ports IO0, IO1, . . . , IO31.

When the number of I/O ports of a device under testing is larger than 32, for example, 64, two tests are required for the tester to complete an I/O testing. It therefore causes time delay in the manufacturing process of electronic devices, if the number of I/O ports under testing is larger than the capacity that the tester can provide.

SUMMARY OF THE INVENTION

It is therefore an objective of the present invention to provide a device and method to complete a testing for all the I/O ports at one time without limiting the number of the I/O ports of an electronic device under testing.

In accordance with the foregoing and other objectives of the present invention, a device and method for testing the I/O ports are provided, which will be described in detail hereinafter.

There are a plurality of switching devices and a decoder employed between the probe card and the DUT card. Every switching device possesses an identical number of input ports and output ports to that of the testing I/O ports of the DUT card. Every testing I/O port of the DUT card is connected to the corresponding output ports of every switching device.

The decoder is used to select a switching device, of which the output ports are connected to the DUT card for testing. The testing capacity can therefore be increased by 4 times if a 2-to-4 decoder in a tester is used Assume that a DUT card can only test 32 I/O ports at one time. The testing capacity can be 4 times as large, i.e. 128 I/O ports, if the tester is used.

In addition, the switching device is consisted of a plurality of complementary MOS (CMOS) transistors acting as switches between the output of the probe card and the testing I/O ports of t he DUT card. Inputs to the decoder are defined within the DUT card so as to determine the address at which a switch having 32 I/O ports is selected for testing.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
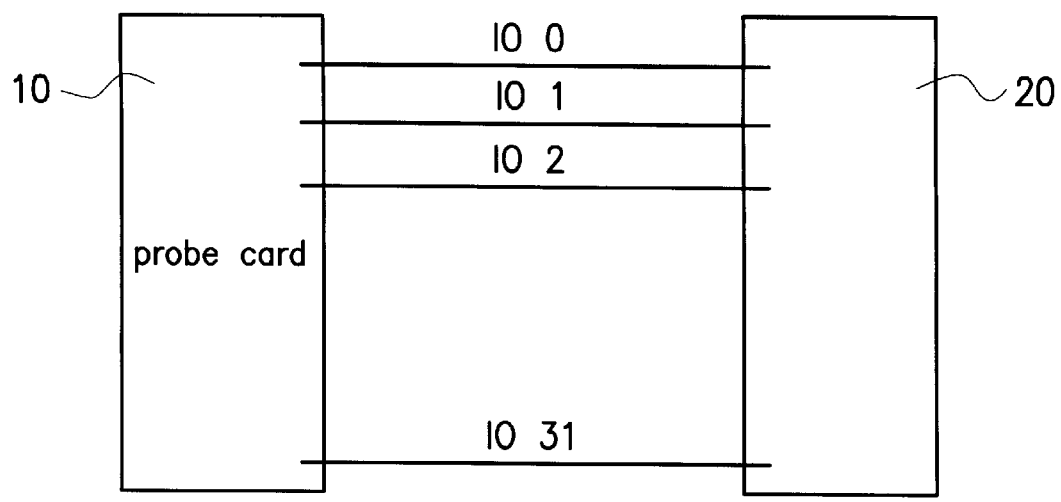
FIG. 1 is a conventional method for testing I/O ports.

Reference will now be made in detail to the present preferred embodiments of the invention, examples of which are illustrated in the accompanying drawings. Wherever possible, the same reference numbers are used in the drawings and the description to refer to the same or like parts.

The device for testing I/O ports comprises a plurality of switching devices and a decoder employed between the probe card and the DUT card. Every switching device possesses an identical number of input ports and output ports to that of the testing I/O ports of the DUT card. The testing I/O ports of the DUT card are connected to the corresponding output ports of every switching device, respectively.

The decoder is used to select a switching device, of which the output ports are connected to the DUT card for testing. The testing capacity can therefore be increased by 4 times if a 2-to-4 decoder in the tester is used. Assume that a DUT card can only test 32 I/O ports at one time. The testing capacity can be 4 times as large, i.e. 128 I/O ports, if the tester is used. In addition, the switching device is consisted of a plurality of complementary MOS (CMOS) transistors acting as switches between the outputs of the probe card and the testing I/O ports of the DUT card. Inputs to the decoder are defined within the DUT card so as to determine the address at which a switch having 32 I/O ports is selected for testing.

Figure 2:
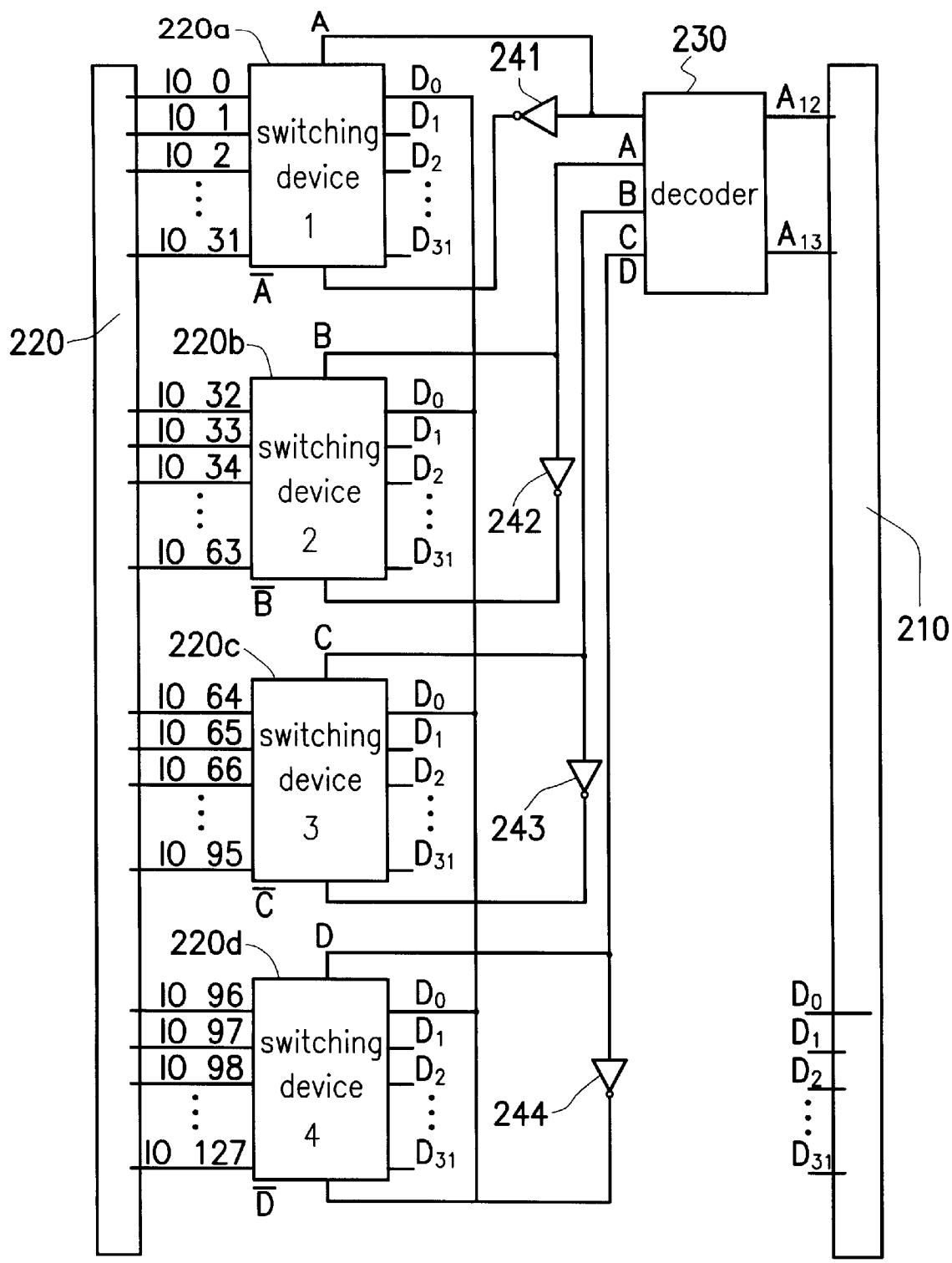
FIG. 2 is a functional block diagram of a device for testing the I/O ports according to a preferred embodiment of the present invention.

Refer to FIG. 2, which shows the functional block diagram of a device for testing the I/O ports according to the preferred embodiment of the present invention, with which a total of 128 I/O ports can be tested at one time.

As shown in the figure, the device comprises 4 switching devices 220a to 220d, a 2-to-4 decoder 230, and 4 inverters 241 to 244, with which a particular switching device is selected so as to allow a 32-ports input entering the DUT card 210 for testing. Three remaining 32-ports inputs are sequentially tested after the first one is completed so that a total number of I/O ports tested is 128.

Note that the switching devices 220a to 220d have an identical number of input ports and output ports to that of the testing I/O ports of the DUT card 210. In this preferred embodiment, there are 32 output ports D0, D1, . . . , D31 in the switching devices 220a to 220d, which are identical to the number of the testing I/O ports of the DUT card 210. Also shown in the figure, there are 32 input ports for every switching device, i.e., IO0 , IO1, . . . , IO31 for the switching device 220a, IO32, IO33, . . . , IO63 for the switching device 220b, IO64, IO65, . . . , IO95 for the switching device 220c, and IO96, IO97, . . . , IO127 for the switching device 220d.

The 128 input ports, IO0, IO1, . . . , IO127, of the 4 switching devices are then coupled to the probe card 200. The output ports D0s of every switching device are connected together and coupled to the testing I/O port D0 of the DUT card 210. Similarly, the D1s, D2s, ..., and D31s of every switching device are coupled to the testing I/O ports D1, D2, ..., and D31 of the DUT card 210, respectively.

The switching devices 220a to 220d further comprise a pair of control input to receive an output signal and a complimentary output signal from the decoder 230, for example, (A,$\overline{A}$), (B,$\overline{B}$), (C,$\overline{C}$), (D,$\overline{D}$), to control the ON/OFF state of the 4 switching devices.

The decoder 230 used in this preferred embodiment is a 2-to-4 one. Two inputs A12 and A13 are defined within the DUT card 210 so as to determine the addresses, at which a switching device is enabled to allow its outputs D0 to D31 for testing in the DUT card 210. The outputs A, B, C, and D from the decoder 230 are connected to the control inputs A, B, C, and D of the switching devices 220a to 220d, respectively. Meanwhile, the outputs A, B, C, and D from the decoder 230 are connected to inverters 241 to 244 to obtain 4 complimentary output signals $\overline{A}$, $\overline{B}$, $\overline{C}$, and $\overline{D}$, respectively, which are connected to the control input $\overline{A}$, $\overline{B}$, $\overline{C}$, and $\overline{D}$ of the switching devices 220a to 220d, respectively.

A12 and A 13 to the decoder 230 determine which switching device should be enabled to allow a 32-ports input entering the DUT card 210 for testing. In this implementation, a decoder and 4 switching devices are used so that 128 I/O ports can then be tested at one time without causing the conventional problem of limiting the number of I/O ports to, for example, 32 or 64, for a testing.

Although the preferred embodiment illustrating the testing of 128 I/O ports uses a 2-to-4 decoder 230, it is not necessarily required to use the 2-to 4 decoder. A decoder with multiple inputs of which two input addresses are selected as A12 and A13 can also be used for this purpose. Of course, a 3-to-8 decoder together with 8 switching devices can be used to test a device with 256 I/O ports, as long as the DUT card 210 provides 32 testing I/O ports. Therefore, the present invention is able to extend its testing capacity without limiting the number of the I/O ports of an electronic device under testing.

Figure 3:
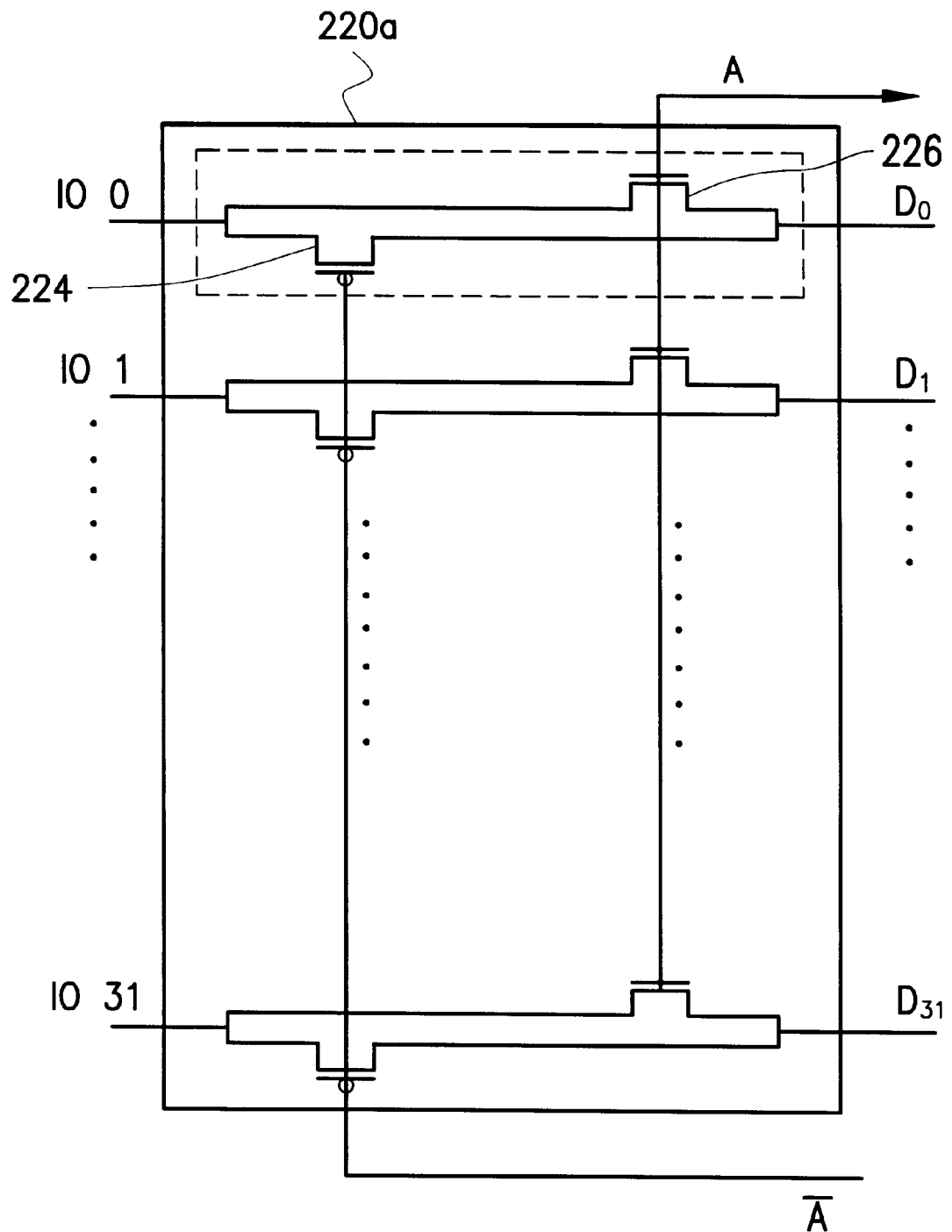
FIG. 3 is a schematic circuit diagram of the switching device of FIG. 2.

Refer to FIG. 3, which shows a schematic circuit diagram of the switching device 220a of FIG. 2. The remaining switching devices 220b to 220d have the same structure as 220a. The switching device 220a comprises a plurality of CMOS transistors 222 as the switches. There are 32 CMOS transistors 222, in which a PMOS transistor 224 and a NMOS transistor 226 are in series. Every CMOS transistor 222 is coupled to an I/O pair, for example, IO0 and D0. The gates of the PMOS transistor 224 in every CMOS transistor 222 are connected together and coupled to the complimentary output $\overline{A}$ from the decoder 230, while the gates of the NMOS transistor 226 in every CMOS transistor 222 are connected together and coupled to the output A from the decoder 230. The PMOS transistor 224 in the CMOS transistor 222 is used as a switch, while the NMOS transistor 226 in the CMOS transistor 222 is mainly for shortening the response time.

Figure 4:
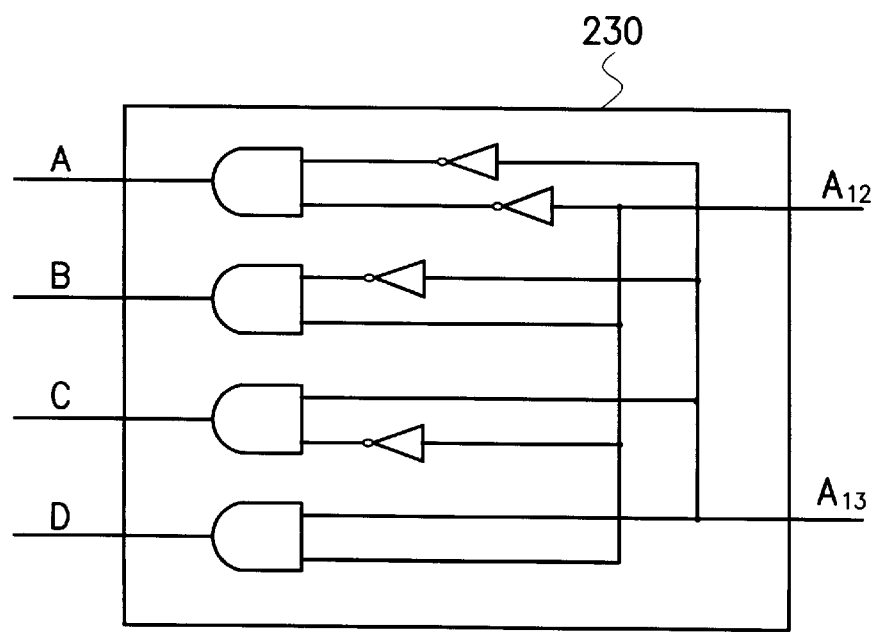
FIG. 4 is a schematic circuit diagram of the decoder of FIG. 2.

Refer to FIG. 4, which shows a schematic circuit diagram of a feasible decoder of FIG. 2.

As a summary, the device and method for testing I/O ports can be used to test an electronic device without physical constraints on the number of its I/O ports so that the problem limiting the number of I/O ports for a device under testing in the conventional tester is avoid.

Therefore, the present invention is characterized by the use of a decoder and a plurality of switching devices to obtain an increasing number of I/O ports for testing at one time. There is no limitation to the number of the I/O ports under testing, so that the testing of a large-size memory can be completed at one time.

Another characteristic of the present invention is that testers with a large number of testing I/O ports are no longer required to test an electronic device with large number of I/O ports. The cost for testing is therefore reduced.

It is another characteristic of the present invention that the device provided can be used not only in a production, but also an experimenting tester environment.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A device used in a tester for testing I/O ports of an electronic device, comprising:

a probe card and a device under test (DUT) card, wherein the DUT card comprises a plurality of testing I/O ports and a plurality of addressing ports;

a plurality of switching devices, wherein the switching device comprises a plurality of input ports, a plurality of output ports, a first control input, and a second control input, wherein the number of input ports and output ports of the switching device is identical to that of the testing I/O ports of the DUT card, wherein the input ports of the switching device are coupled to the probe card, wherein the $I_{th}$ output ports with the same relative position of all the switching devices are connected together and coupled to the $I_{th}$ testing I/O port of the DUT card; and a decoder which comprises a plurality of inputs and outputs, wherein the inputs of the decoder are coupled to the addressing ports of the DUT card, wherein the outputs of the decoder acting as the control signals and complimentary control signals are connected to the first control input and the second control input of the switching devices, respectively, to enable one of the switching devices.

2. The device of claim 1, wherein the switching device further comprises a plurality of CMOS transistors, wherein the CMOS transistor is consisted of a PMOS and a NMOS transistor in series, wherein the CMOS transistor is coupled to a testing I/O port of the DUT card and the probe card.

3. The device of claim 2, wherein the gates of the PMOS transistors in all the CMOS transistors are connected together acting as the second control input of the switching device; the gates of the NMOS transistors in all the CMOS transistors are connected together acting as the first control input for the switching device.

4. The device of claim 1, wherein the tester is a production-type tester.

5. A device used in a tester for testing I/O ports of an electronic device, comprising:

a device under test (DUT) card, wherein the DUT card comprises a plurality of testing I/O ports and a plurality of addressing ports;

a plurality of switching devices, wherein the switching device comprises a plurality of input ports, a plurality of output ports, a first control input, and a second control input, wherein the number of input ports and output ports of the switching device is identical to that of the testing I/O ports of the DUT card, wherein the $I_{th}$ output ports with the same relative position of all the switching devices are connected together and coupled to the $I_{th}$ testing I/O port of the DUT card; and a decoder which comprises a plurality of inputs and outputs, wherein the inputs of the decoder are coupled to the addressing ports of the DUT card, wherein the outputs of the decoder acting as the control signals and complimentary control signals are connected to the first control input and the second control input of the switching devices, respectively, to enable one of the switching devices.

6. The device of claim 5, wherein the switching device further comprises a plurality of CMOS transistors, wherein the CMOS transistor is consisted of a PMOS and a NMOS transistor in series, wherein the CMOS transistor is coupled to a testing I/O port of the DUT card.

7. The device of claim 6, wherein the gates of the PMOS transistors in all the CMOS transistors are connected together acting as the second control input of the switching device; the gates of the NMOS transistors in all the CMOS transistors are connected together acting as the first control input for the switching device.

8. The device of claim 5, wherein the tester is a production-type tester.

9. A method used in a device under test (DUT) card with a plurality of testing I/O ports and a plurality of switching devices connected to a plurality of addressing ports in a tester for testing I/O ports of an electronic device, comprising the steps of:

(a) determining the addressing ports physically used;

(b) performing an addressing operation to select a plurality of I/O ports for testing; and (c) performing a testing operation.

10. The method of claim 9, wherein the addressing operation is implemented by using a decoder.

11. The method of claim 9, wherein the selection of the I/O ports for testing is controlled via the switching device, wherein the output ports of the switching device is connected to the DUT card.

12. The method of claim 11, wherein the switching device comprises a plurality of CMOS transistors.

13. The method of claim 9, wherein the tester is a production-type tester.

14. The method of claim 9, wherein the tester is an experimenting-type tester.

15. The method of claim 9, wherein each addressing port is connected to the input ports of each switching device.

* * * * *